(12) United States Patent
Tseng et al.

(10) Patent No.: US 11,611,300 B2
(45) Date of Patent: Mar. 21, 2023

(54) CURRENT SENSING CORRECTION METHOD AND DRIVING SYSTEM USING SAME

(71) Applicant: Delta Electronics, Inc., Taoyuan (TW)

(72) Inventors: Shao-Kai Tseng, Taoyuan (TW); Yi-Jan Chang, Taoyuan (TW); Sheng-Han Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 78 days.

(21) Appl. No.: 17/443,795

(22) Filed: Jul. 27, 2021

(65) Prior Publication Data
US 2022/0166355 A1    May 26, 2022

(30) Foreign Application Priority Data
Nov. 25, 2020    (CN) .......................... 202011336629.5

(51) Int. Cl.
     *G05F 1/70*      (2006.01)
     *H02P 21/14*      (2016.01)
     (Continued)

(52) U.S. Cl.
     CPC ............ *H02P 21/14* (2013.01); *G01R 15/202* (2013.01); *G01R 19/0092* (2013.01);
     (Continued)

(58) Field of Classification Search
     CPC .......... H02P 21/14; H02P 21/22; H02P 27/06; H02P 29/028; H02P 21/05; H02M 1/0009; H02M 7/53871
See application file for complete search history.

(56) References Cited

U.S. PATENT DOCUMENTS

| 4,947,021 A * | 8/1990 | Stava | B23K 9/1006 |
| | | | 219/130.51 |
| 8,920,026 B2 * | 12/2014 | Lazarov | G01R 19/00 |
| | | | 374/170 |

(Continued)

FOREIGN PATENT DOCUMENTS

| CN | 206759305 U | 12/2017 |
| EP | 1791138 B1 | 8/2010 |

(Continued)

*Primary Examiner* — Muhammad S Islam
(74) *Attorney, Agent, or Firm* — Kirton McConkie; Evan R. Witt

(57) ABSTRACT

A current sensing correction method for a driving system is provided. Firstly, the detection values of a three-phase current are acquired through the measuring unit. When the three-phase current is maintained at the DC state, the DC values of the three-phase current are acquired and recorded as three-phase demagnetization values. When the detection values are zero, a d-axis current and a q-axis current are calculated according to the three-phase demagnetization values, a d-axis correction current command and a q-axis correction current command are calculated according to a proportional constant, the d-axis current and the q-axis current, and a three-phase demagnetization current is generated to the measuring unit according to the d-axis correction current command and the q-axis correction current command. When the demagnetization time reaches the first predetermined time, the three-phase demagnetization current is not generated.

11 Claims, 8 Drawing Sheets

(51) Int. Cl.
*H02P 21/22*     (2016.01)
*H02P 27/06*     (2006.01)
*G01R 15/20*     (2006.01)
*H02M 1/00*      (2006.01)
*G01R 19/00*     (2006.01)
*H02M 7/5387*    (2007.01)

(52) U.S. Cl.
CPC ..... *H02M 1/0009* (2021.05); *H02M 7/53871* (2013.01); *H02P 21/22* (2016.02); *H02P 27/06* (2013.01)

(56) References Cited

U.S. PATENT DOCUMENTS

| | | | |
|---|---|---|---|
| 9,110,119 | B2 | 8/2015 | Sasaki et al. |
| 2005/0017695 | A1* | 1/2005 | Stanley ............... H02M 1/4208 323/207 |
| 2008/0197950 | A1 | 8/2008 | Maurer et al. |
| 2009/0257257 | A1* | 10/2009 | Adragna ............ H02M 3/1584 363/65 |

FOREIGN PATENT DOCUMENTS

| | | |
|---|---|---|
| JP | 2003018852 A | 1/2003 |
| KR | 20100003027 A | 1/2010 |
| KR | 20150090781 A | 8/2015 |
| TW | 350916 B | 1/1999 |
| TW | I343171 B | 6/2011 |
| TW | M440600 U | 11/2012 |

\* cited by examiner

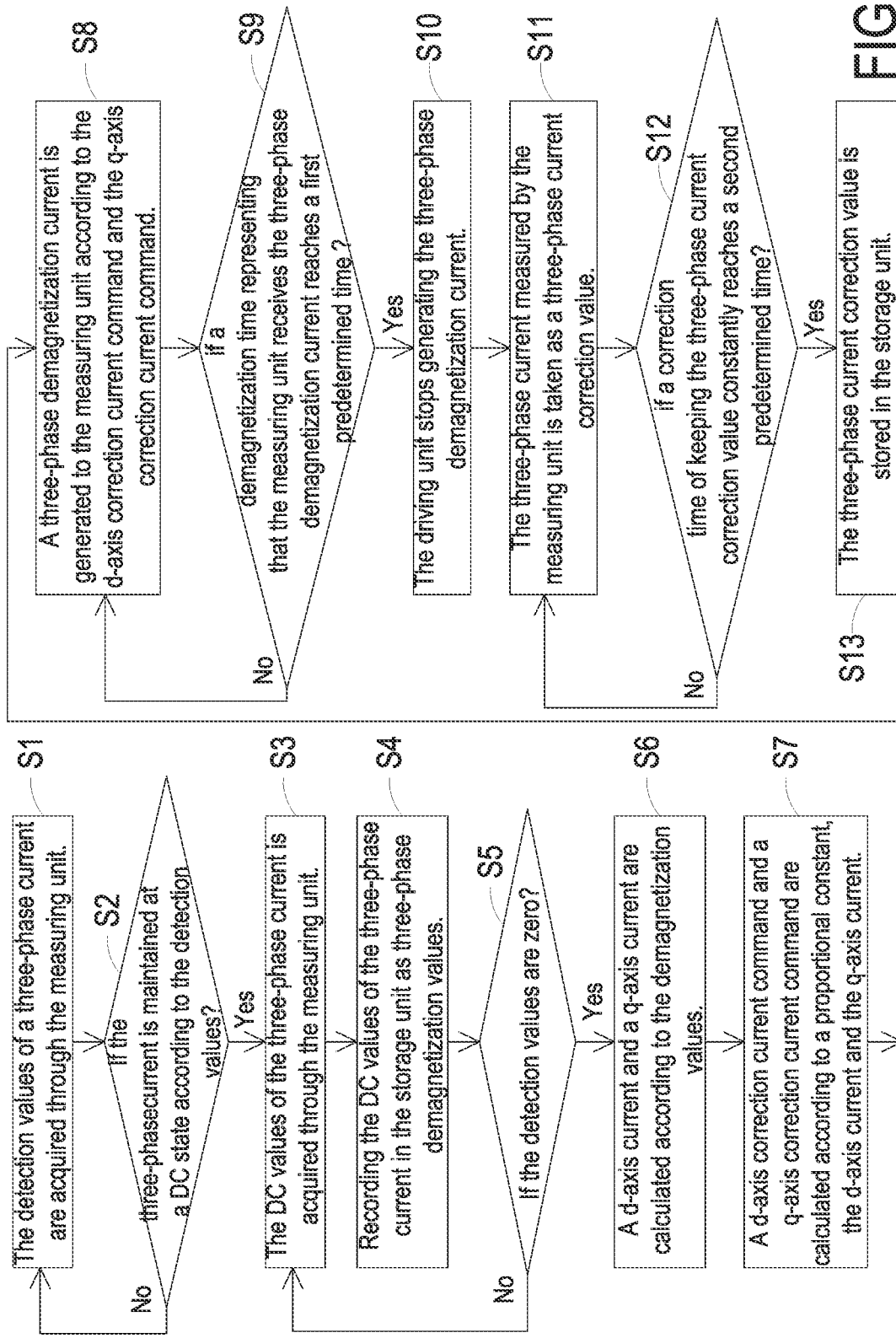

US 11,611,300 B2

CURRENT SENSING CORRECTION METHOD AND DRIVING SYSTEM USING SAME

FIELD OF THE INVENTION

The present disclosure relates to a current sensing correction method, and more particularly to a current sensing correction method for a driving system. The present disclosure also relates to a driving system using the current sensing correction method.

BACKGROUND OF THE INVENTION

Nowadays, a current sensor including a magnetoelectric conversion element (e.g., a Hall sensor) has been widely used in a driving system for driving a load device (e.g., a motor). The current sensor is configured to detect a three-phase current from the driving system and generate a corresponding voltage detection signal. According to the voltage detection signal, the three-phase current is correspondingly adjusted by the driving system.

Please refer to FIG. 1 and FIG. 2A. FIG. 1 is a schematic timing waveform diagram illustrating any two current components of the three-phase current outputted from a conventional driving system. FIG. 2A is a plot illustrating the relationship between the magnetic flux density and the magnetic field intensity (B-H) of a current sensor. For example, the load device is a motor of an elevator. Before the elevator reaches the corresponding floor and the mechanical brake device fixes the motor, the drive system needs to output a DC three-phase current to allow the motor to generate torque to support the load. Consequently, the rotation speed of the motor is maintained at zero. In this way, the elevator can be stayed on the corresponding floor. In FIG. 1, two current components (e.g., the a-phase current component is and the b-phase current component ib) of the three-phase current outputted from the driving system are shown. When the motor of the elevator continuously outputs torque and the rotation speed of the motor is maintained at zero, the a-phase current component is and the b-phase current component ib of the three-phase current are maintained at the DC state for a certain time until the motor is fixed by the mechanical brake device. Therefore, it indicates that the three-phase current keeps at the DC state for a certain time before the mechanical brake device brakes the motor. When the motor is fixed by the mechanical brake device, the drive system stops outputting the three-phase current.

Before the motor of the elevator runs normally, the motor enters a start-up state. After the motor enters a start-up state and before the motor is released by the mechanical brake device, the motor is still fixed and stopped by the mechanical brake device. After the motor is released by the mechanical brake device, the driving system needs to provide the three-phase current to the motor. Consequently, the motor generates the output torque to balance the load torque in order to implement the zero-speed control operation. Consequently, the elevator car can be stayed on the corresponding floor. At this time, the three-phase current is maintained at the DC state. When the motor starts to run normally, the three-phase current is in the AC state.

The characteristics of the current sensor with the magnetoelectric conversion element are shown in FIG. 2A. When the current sensor detects that the three-phase current value maintained at the DC state is zero, there is residual magnetization on the current sensor because of the magnetic field generated by the DC current. For example, the point A or point A1 as shown in FIG. 2A denotes the residual magnetization. Consequently, the voltage detection signal generated by the current sensor corresponding to the zero current will reflect the temporary voltage deviation phenomenon caused by the residual magnetization. Due to the temporary voltage deviation phenomenon, the current value of the current sensor read by a controller results in serious errors.

FIG. 2B is a schematic diagram illustrating the relationship between the output current and the read value of the current read by the current sensor. Please refer to FIGS. 2A and 2B. Assuming the residual magnetization on the current sensor is curve A, the residual magnetization possibly causes the current sensor to generate read value V1. In fact, the current signal on the current sensor is zero, so the current sensor should not generate any read values. Similarly, assuming the residual magnetization on the current sensor is curve A1, the residual magnetization possibly causes the current sensor to generate read value V2. In other words, the read value of the current sensor has a large error.

Moreover, after the load device is driven to be temporarily stopped, the driving system has to read the voltage detection signal from the current sensor. According to the voltage detection signal, the driving system performs the current offset correction of the three-phase current. The purpose of the current offset correction is to compensate two known and predictable current offset factors. In accordance with a first factor, the control unit in the driving system is only able to read positive signals. Consequently, it is necessary to add a preset voltage offset value to the detection result of the current sensor. In this way, the detection results of the current sensor received by the control unit are all positive values. In accordance with the second factor, the temperature drift of the current sensor causes the voltage shift on the sensing results. The first factor and the second factor can be corrected by detecting the voltage signal of the current sensor when there is no current output. Consequently, these two factors can be correctly compensated when the driving system performs the current offset correction on the three-phase current.

However, due to the residual magnetization effect of the current sensor, some drawbacks occur. For example, when the driving system stops driving the load device and performs the current offset correction on the three-phase current, the detection result read by the current sensor actually contains the error associated with the residual magnetization. Since the error caused by the residual magnetization is temporary and unable to be predicted in advance, the driving system cannot implement the current offset correction accurately. As a result, the performance of the driving system is deteriorated. While the driving system drives the load device and performs the current control operation, the current ripple with the frequency the same as the driving frequency is generated. Consequently, vibration and noise are also generated.

For solving the drawbacks of the conventional technologies, there is a need of providing an improved current sensing correction method and a driving system using the current sensing correction method.

SUMMARY OF THE INVENTION

An object of the present disclosure provides a current sensing correction method for a driving system to reduce the influence of the residual magnetization on the current offset correction. Consequently, the driving system can implement the current offset correction more accurately. As a result, the performance of the driving system is enhanced, and the vibration and noise generated by the load device are reduced.

Another object of the present disclosure provides a driving system using the current sensing correction method.

In accordance with an aspect of the present disclosure, a current sensing correction method for a driving system is provided. The driving system includes a driving unit, a control unit, a measuring unit and a storage unit. The driving unit provides a three-phase current to a load device. The control unit performs the current sensing correction method. The current sensing correction method includes the following steps. Firstly, detection values of the three-phase current are acquired through the measuring unit. Then, the control unit determines whether the three-phase current is maintained at a DC state according to the detection values of the three-phase current. When the three-phase current is maintained at the DC state, the DC values of the three-phase current are acquired through the measuring unit. Then, the DC values of the three-phase current are recorded in the storage unit as three-phase demagnetization values. When the control unit determines that the detection values are zero, the control unit calculates a d-axis current and a q-axis current according to the three-phase demagnetization values, calculates a d-axis correction current command and a q-axis correction current command according to a proportional constant, the d-axis current and the q-axis current, and controls the driving unit to generate a three-phase demagnetization current to the measuring unit according to the d-axis correction current command and the q-axis correction current command. Then, the control unit determines if a demagnetization time representing that the measuring unit receives the three-phase demagnetization current reaches a first predetermined time. When the demagnetization time reaches the first predetermined time, the control unit controls the driving unit to stop generating the three-phase demagnetization current.

In accordance with another aspect of the present disclosure, a driving system is provided. The driving system includes a driving unit, a measuring unit, a storage unit and a control unit. The driving unit provides a three-phase current to a load device. The measuring unit measures the three-phase current and generates detection values of the three-phase current. The control unit is connected with the driving unit, the measuring unit and the storage unit. The control unit determines whether the three-phase current is maintained at a DC state according to the detection values of the three-phase current. When the control unit determines that the three-phase current is maintained at the DC state, the control unit acquires DC values of the three-phase current through the measuring unit and records the DC values of the three-phase current in the storage unit as three-phase demagnetization values. When the control unit determines that the detection values are zero, the control unit calculates a d-axis current and a q-axis current according to the three-phase demagnetization values, calculates a d-axis correction current command and a q-axis correction current command according to a proportional constant, the d-axis current and the q-axis current, and controls the driving unit to generate a three-phase demagnetization current to the measuring unit according to the d-axis correction current command and the q-axis correction current command.

The above contents of the present disclosure will become more readily apparent to those ordinarily skilled in the art after reviewing the following detailed description and accompanying drawings, in which:

BRIEF DESCRIPTION OF THE DRAWINGS

FIG. 6 is a flowchart of a current sensing correction method according an embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 3A:
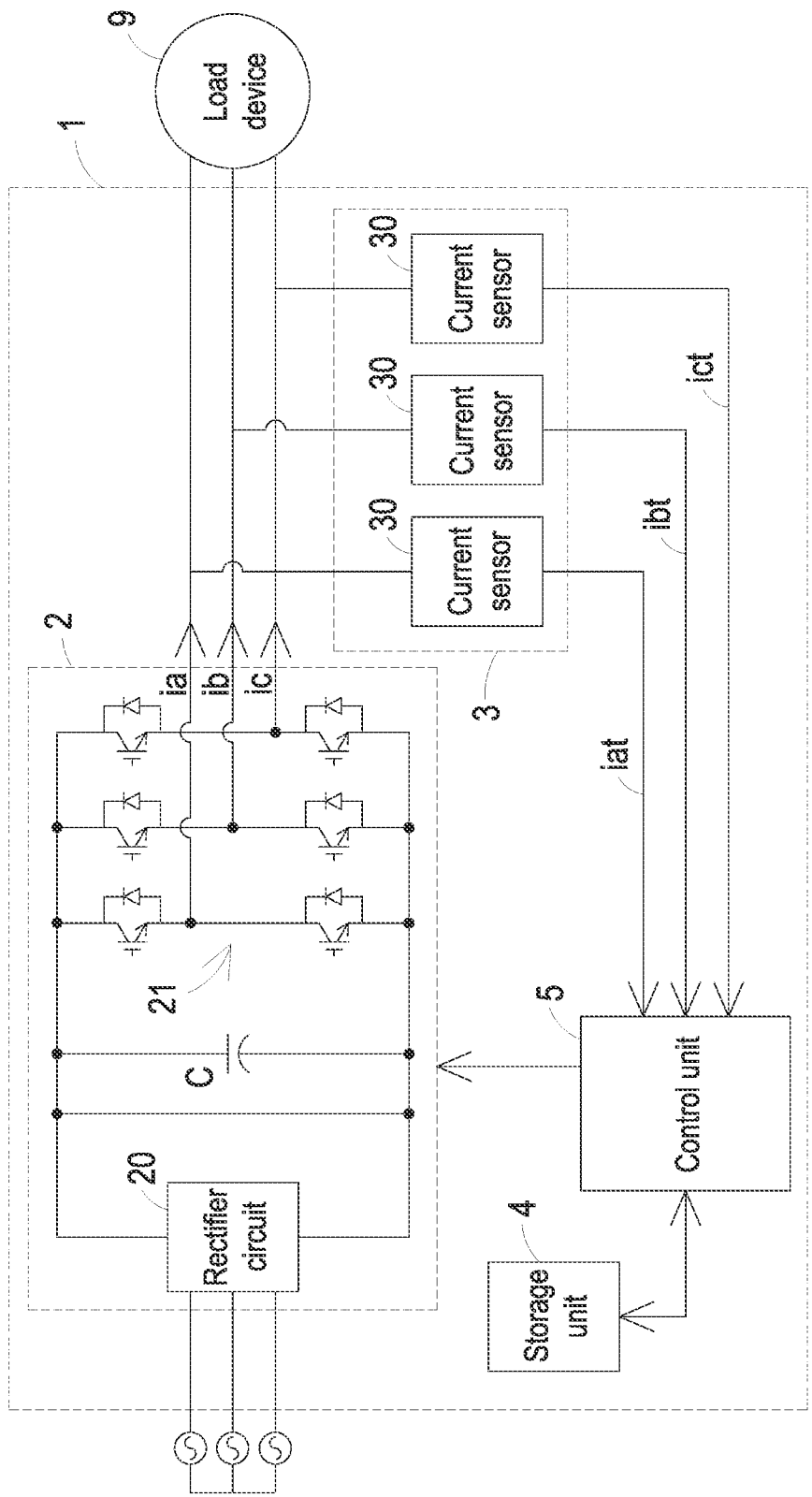
FIG. 3A is a schematic circuit block diagram illustrating a driving system according to an embodiment of the present disclosure.

FIG. 3A is a schematic circuit block diagram illustrating a driving system 1 according to an embodiment of the present disclosure. As shown in FIG. 3A, the driving system 1 is applied to drive a load device 9. Preferably but not exclusively, the load device 9 is a motor of an elevator. In this embodiment, the driving system 1 includes a driving unit 2, a measuring unit 3, a storage unit 4 and a control unit 5.

The driving unit 2 is electrically connected to the load device 9. The driving unit 2 receives and converts an input current. After the input current is converted by the driving unit 2, a three-phase current including three phase current components ia, ib and ic is generated to drive the load device 9. In addition, the driving unit 2 may drive the load device 9 to enter a standby state. In an embodiment, the driving unit 2 includes a rectifier circuit 20, a bus capacitor C and a inverter 21. In case that the input current is a single-phase input current, the rectifier circuit 20 is a single-phase rectifier circuit. In case that the input current is a three-phase input current, the rectifier circuit 20 is a three-phase rectifier circuit. The inverter 21 includes a plurality of switch elements. The circuitry structures and the operations of the rectifier circuit 20, the bus capacitor C and the inverter 21 are well known to those skilled in the art, and not redundantly described herein.

The measuring unit 3 is configured to measure the three phase current components ia, ib and ic of the three-phase current and generate the corresponding detection values iat, ibt and ict. In some embodiments, the measuring unit 3 includes a plurality of current sensors 30 (e.g., three current sensors). The current sensor 30 includes a magnetoelectric conversion element. For example, the current sensors 30 are Hall sensors. The measuring unit 3 includes three current sensors 30, and the three current sensors 30 are configured to measure the three phase current components ia, ib and ic of the three-phase current respectively. The current components ia, ib and ic are single-phase currents, respectively. In some embodiments, the measuring unit 3 includes two current sensors 30 to measure a first phase current component and a second phase current component of the three phase current components ia, ib and ic of the three-phase current. According to the detection results about the first phase current component and the second phase current component, the control unit 5 can obtain the third phase current component of the three phase current components ia, ib and ic. The first phase current component, the second phase current component and the third phase current component may be arbitrarily selected from the three phase current components ia, ib and ic according to the practical requirements.

The detection values from the measuring unit 3 can be stored in the storage unit 4. An example of the storage unit 4 includes but is not limited to a non-volatile memory, e.g., a flash memory, an erasable and programmable read-only memory (EPROM), an electrically erasable and programmable read-only memory (EEPROM) or a hard disk.

The control unit 5 is coupled to the driving unit 2, the measuring unit 3 and the storage unit 4. The control unit 5 is configured to control the operation of the driving system 1. The control unit 5 can output a control command to the driving unit 2. According to the control command, the inverter 21 of the driving unit 2 outputs the three-phase current (ia, ib, ic) to drive the load device 9. An example of the control unit 5 includes but is not limited to a microcontroller, a processor or a central processing unit (CPU).

Figure 3B:
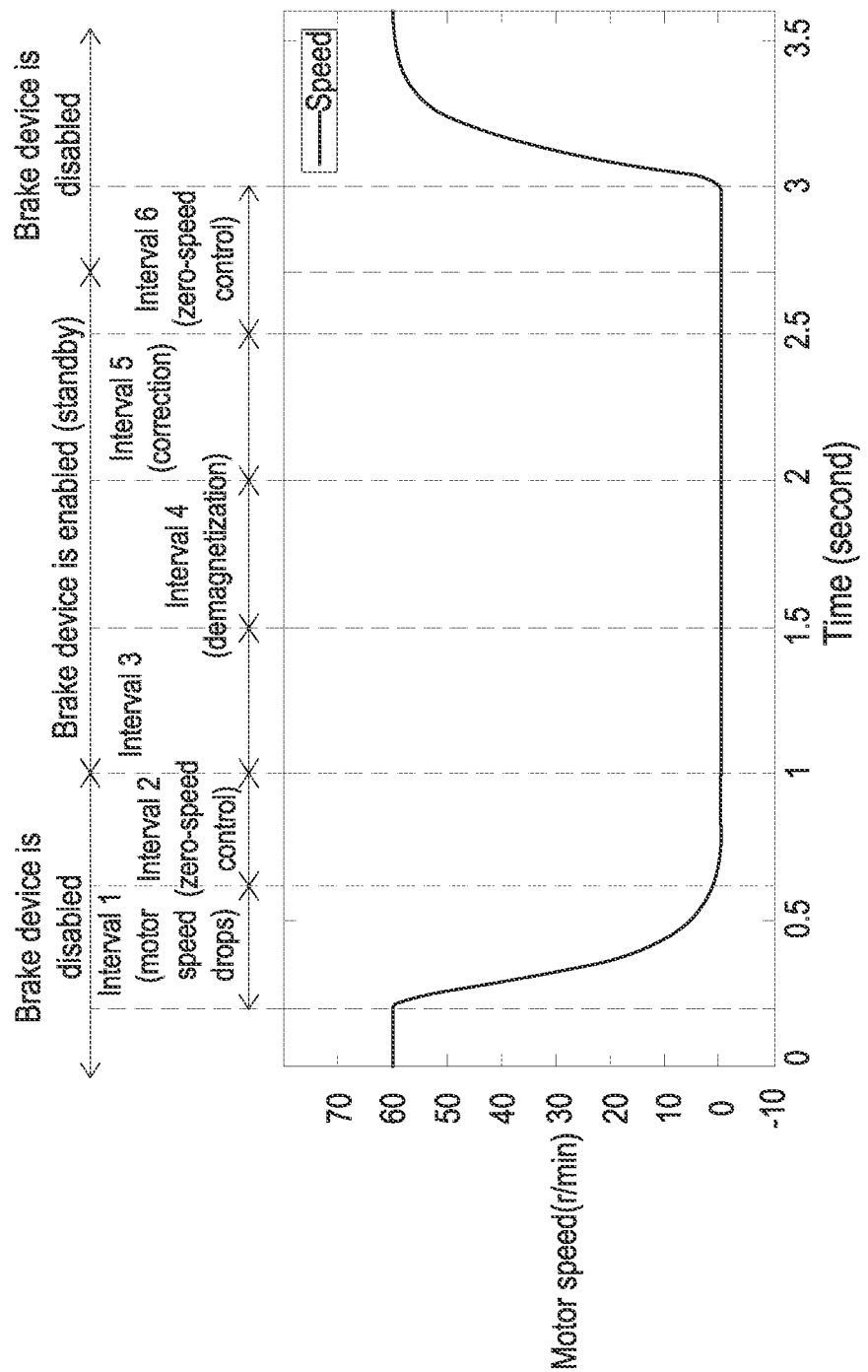
FIG. 3B is a schematic timing waveform diagram illustrating the rotation speed of the load device that is connected with the driving system according to the embodiment of the present disclosure.
Figure 3C:
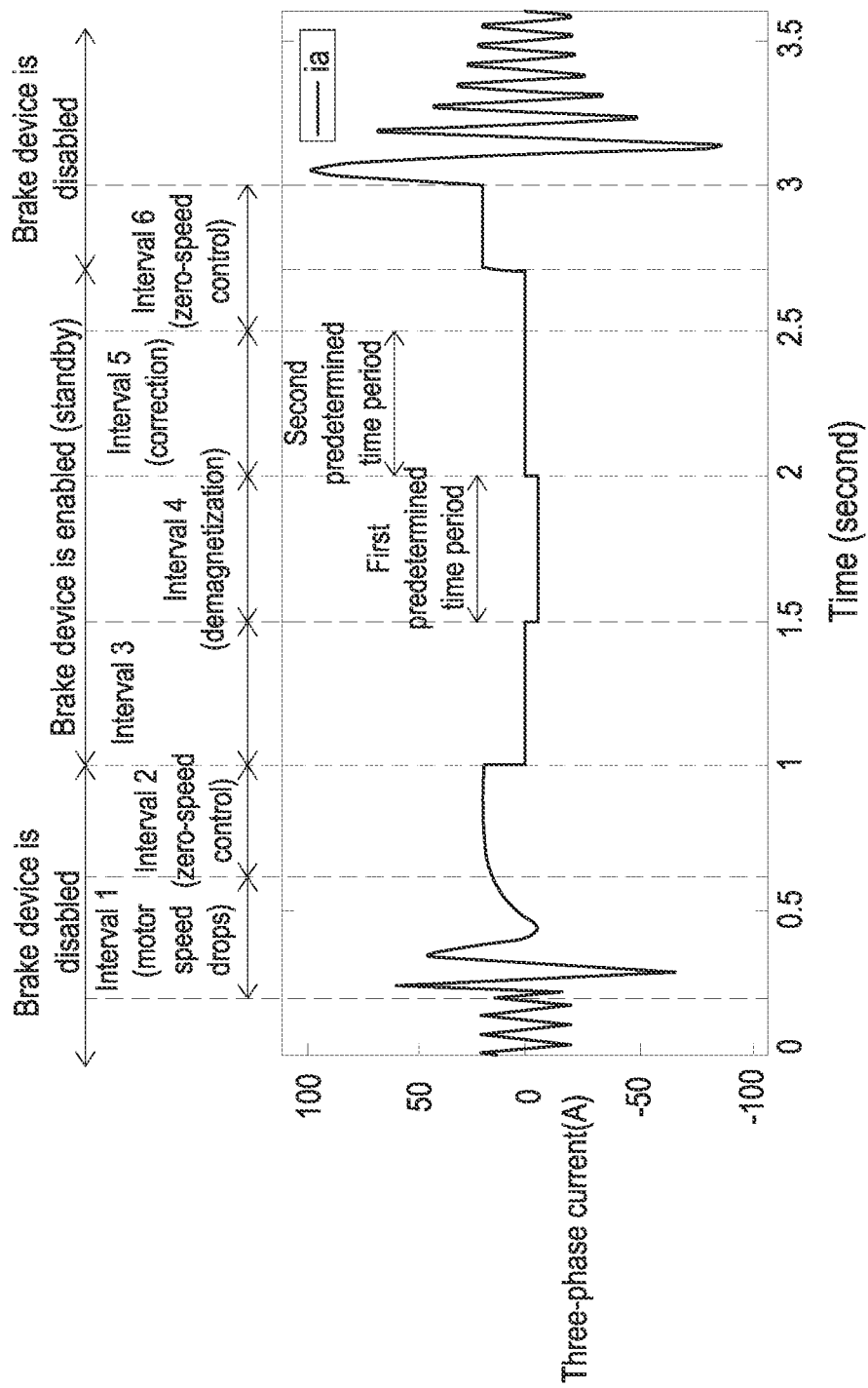
FIG. 3C is a schematic timing waveform diagram illustrating the three-phase current generated by the driving system according to the embodiment of the present disclosure.

FIG. 3B is a schematic timing waveform diagram illustrating the rotation speed of the load device that is connected with the driving system according to the embodiment of the present disclosure. FIG. 3C is a schematic timing waveform diagram illustrating the three-phase current generated by the driving system according to the embodiment of the present disclosure. For succinctness, only the waveform of the phase current component ia of the three-phase current is shown in FIG. 3C.

As mentioned above, the driving system 1 of the present disclosure can be applied to an elevator system. Generally, the elevator system includes an elevator car (not shown), a motor and a brake device (not shown). For example, the motor is the load device 9 as shown in FIG. 3A.

Please refer to FIG. 3A again. After the driving system 1 outputs the three phase current components ia, ib and ic of the three-phase current to the motor, the motor moves the elevator car according to the three-phase current. The brake device is configured to fix the motor, so that the elevator car is stayed on the designated floor.

The operations of the driving system 1 to control the motor will be illustrated in more details as follows.

Please refer to the time interval 1 as shown in FIGS. 3B and 3C. When the elevator car approaches the designated floor, the control unit 5 controls the driving unit 2 to reduce the frequency of the three-phase current (ia, ib, ic) in the AC state. Consequently, in the time interval 1 of FIG. 3B, the rotation speed of the motor is gradually decreased.

When the elevator car is just arrived at the designated floor, the control unit 5 controls the drive unit 2 to maintain the three-phase current (ia, ib, ic) at the DC state in the time interval 2 of FIG. 3C. Meanwhile, according to the three-phase current (ia, ib, ic) in the DC state, the motor generates torque to support the weight of the elevator car. Since the torque produced by the motor is in force balance with the weight of the elevator, the rotation speed of the motor is zero in the time interval 2 of FIG. 3B. In other words, the motor is in the zero-speed control state. In the time interval 1 and the time interval 2, the brake device of the elevator is not enabled to fix the motor. Generally, when the elevator car is just arrived at the designated floor, it is not confirmed whether the elevator car is aligned with the designated floor (i.e., in the levelling state). Under this circumstance, it is necessary to perform the zero-speed control operation on the motor, and thus the elevator car is stayed on the designated floor and finely tuned to the levelling state.

In the time interval 2 of FIGS. 3B and 3C, the control unit 5 determines whether the three-phase current (ia, ib, ic) is maintained at the DC state according to the detection values iat, ibt and ict. When the control unit 5 determines that the three-phase current (ia, ib, ic) is not maintained at the DC state and restored to the AC state, it means that the motor is not subjected to the zero-speed control operation. Meanwhile, the control unit 5 continuously acquires the detection values iat, ibt and ict. Whereas, when the control unit 5 determines that the three-phase current (ia, ib, ic) is maintained at the DC state, it means that the motor is subjected to the zero-speed control operation. Then, the control unit 5 acquires the DC values of the phase current components ia, ib and ic of the three-phase current from the measuring unit 3. Then, the DC values of the phase current components ia, ib and ic of the three-phase current are stored into the storage unit 4 under control of the control unit 5. These DC values will be used in the demagnetization of the current sensors 30. Then, the DC values stored in the storage unit 4 are used as three-phase demagnetization values under control of the control unit 5.

In the time interval 2 of FIG. 3C, the DC values of the phase current components ia, ib and ic of the three-phase current are the main causes of the residual magnetization of the current sensor 30 in the measuring unit 3. That is, the extent of the residual magnetization influencing the current sensor 30 is directly related to the magnitudes of the three-phase demagnetization values. That is, the three-phase demagnetization values are the main reason why the current sensor 30 cannot accurately measure the three-phase current (ia, ib, ic).

When the control unit 5 determines that the detection values iat, ibt and ict corresponding to the three-phase current (ia, ib, ic) are zero, the control unit 5 determines that the brake device fixes the motor. That is, in the time interval 3 of FIGS. 3B and 3C, the rotation speed of the motor must be zero and the phase current components ia, ib and ic of the three-phase current are close to zero. Consequently, the control unit 5 determines that the motor enters the standby state.

Consequently, when the control unit 5 determines that the detection values iat, ibt and ict corresponding to the three-phase current (ia, ib, ic) are zero in the time interval 3 of FIG. 3C, the control unit 5 calculates a d-axis current and a q-axis current according to the three-phase demagnetization values stored in the storage unit 4. Then, the control unit 5 also calculates a d-axis correction current command and a q-axis correction current command according to a proportional constant, the d-axis current and the q-axis current. After the d-axis correction current command and the q-axis correction current command are calculated by the control unit 5, the process in the time interval 3 of FIG. 3C is achieved.

Then, in the time interval 4 of FIG. 3C, the control unit 5 controls the driving unit 2 to generate a three-phase demagnetization current to the measuring unit 3 according to the d-axis correction current command and the q-axis correction current command. Then, the control unit 5 determines whether if a demagnetization time representing that the measuring unit 3 receives the three-phase demagnetization current reaches a first predetermined time. For example, as shown in FIG. 3C, the time interval 4 is in the range between the 1.5-th second and 2nd second. That is, the first predetermined time is 0.5 second. The first predetermined time is set through an application program. Moreover, the first predetermined time can be adjusted according to the practical requirements.

Figure 1:
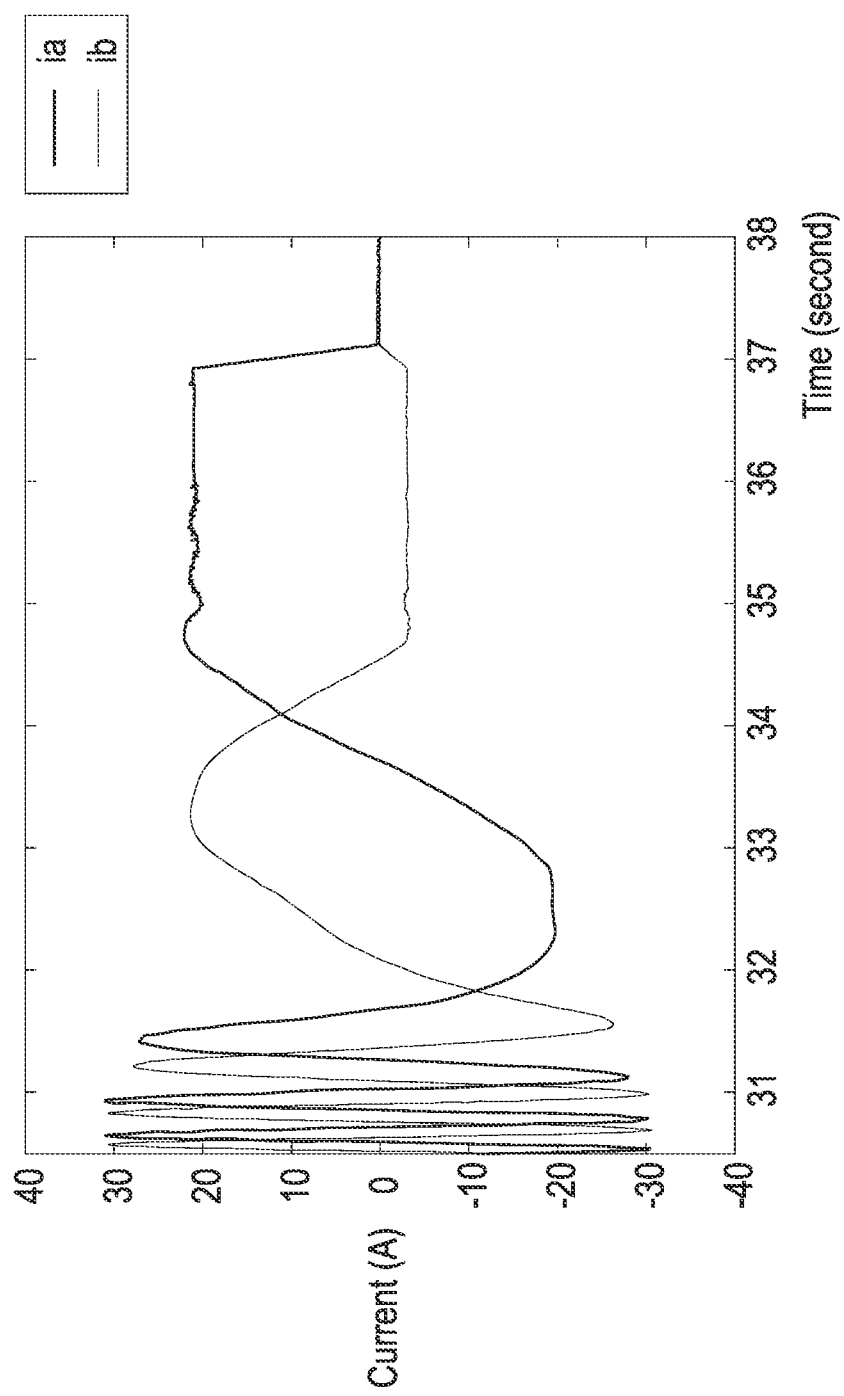
FIG. 1 is a schematic timing waveform diagram illustrating any two current components of the three-phase current outputted from a conventional driving system.
Figure 2B:
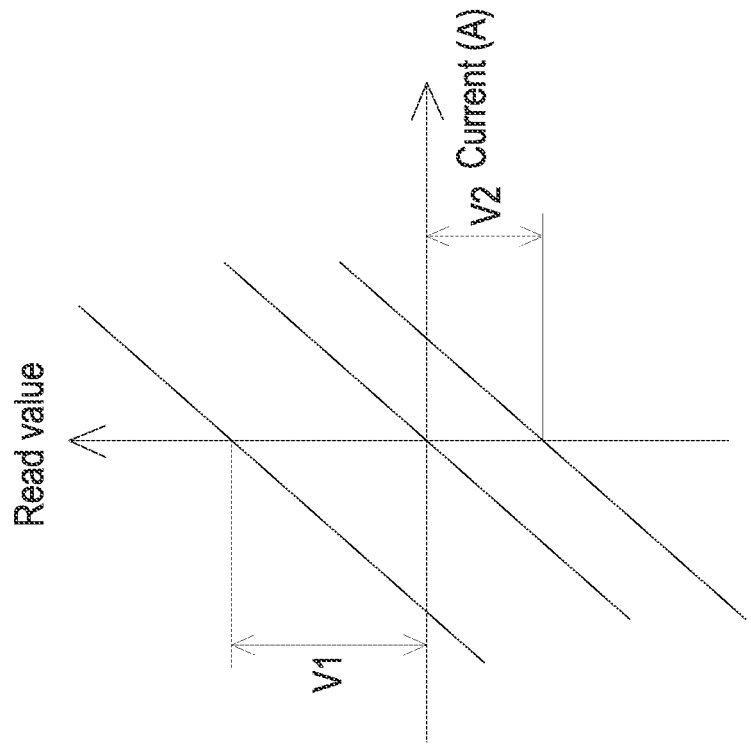
FIG. 2B is a schematic diagram illustrating the relationship between the output current and the read value of the current read by the current sensor.
Figure 2A:
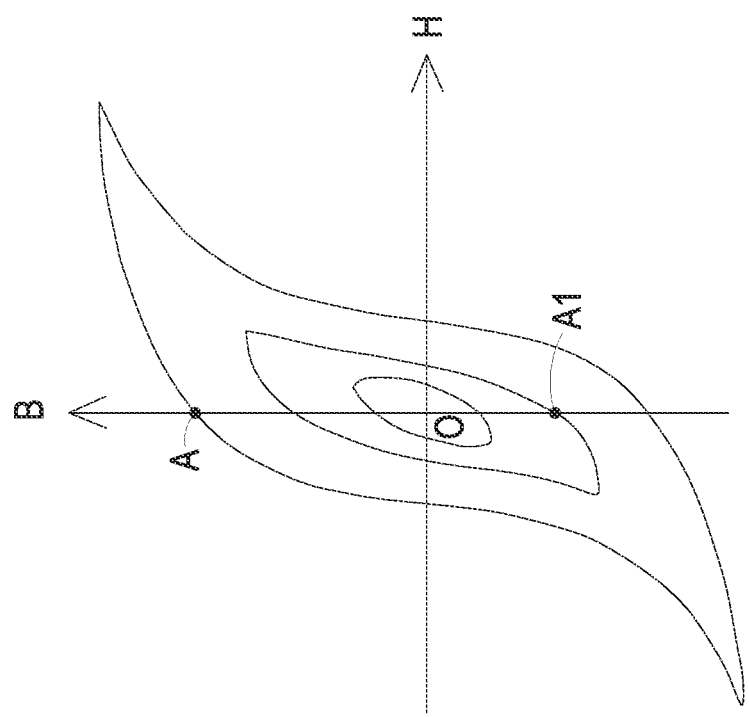
FIG. 2A is a plot illustrating the relationship between the magnetic flux density and the magnetic field intensity (B-H) of a current sensor.

When the control units 5 determines that the demagnetization time reaches the first predetermined time, the control unit 5 controls the driving unit 2 to stop generating the three-phase demagnetization current. Then, in the time interval 5 of FIG. 3C, the control unit 5 controls the measuring unit 3 to detect the three phase current components ia, ib and ic of the three-phase current. In addition, the three-phase current (ia, ib, ic) obtained at this time is taken as a three-phase current correction value. After the measuring unit 3 receives the three-phase demagnetization current and the residual magnetization effect is eliminated, the phase current components ia, ib and ic of the three-phase current may be considered as the offset values of the current read values (e.g., offset values V1 or V2 as shown in FIG. 2B).

Then, in the time interval 5 of FIG. 3C, the control unit 5 determines if a correction time of keeping the three-phase current correction value constantly reaches a second predetermined time. For example, as shown in FIG. 3C, the time interval 5 is in the range between the 2nd second and the 2.5-th second. That is, the second predetermined time is 0.5 second. The second predetermined time is set through an application program. Moreover, the second predetermined time can be adjusted according to the practical requirements. When the correction time reaches the second predetermined time, the control unit 5 stores the three-phase current correction value in the storage unit 4. Whereas, when the correction time has not reached the second predetermined time, the control unit 5 continuously determines the three-phase current correction value.

Please refer to the time interval 6 of FIG. 3C. When the elevator car is ready to move to the next designated floor, the brake device releases the motor and no longer fixes the motor. When the brake device is not enabled and the motor is not fixed by the brake device, the control unit 5 performs the zero-speed control operation on the motor. While the zero-speed control operation is performed on the motor (i.e., the load device 9), the control unit 5 determines whether the motor is in the running state according to the detection values (iat, ibt, ict) of the three-phase current (ia, ib, ic). Under this circumstance, the control unit 5 acquires the detection values (iat, ibt, ict) of the three-phase current (ia, ib, ic) through the measuring unit 3 and acquires the three-phase correction value of the three-phase current (ia, ib, ic) stored in the storage unit 4. After the three-phase correction value stored in the storage unit 4 is subtracted from the detection values by the control unit 5, the real values of the three-phase current (ia, ib, ic) are obtained. Then, the control unit 5 controls the operation of the driving unit 2 according to the real values of the three-phase current (ia, ib, ic).

After the time interval 6 of FIG. 3C, the three-phase current (ia, ib, ic) is in the AC state. Consequently, the motor is in the running state to move the elevator car. Under this circumstance, the control unit 5 also acquires the detection values (iat, ibt, ict) of the three-phase current (ia, ib, ic). After the three-phase correction value stored in the storage unit 4 is subtracted from the detection values of the three-phase current (ia, ib, ic) by the control unit 5, the real values of the three-phase current (ia, ib, ic) are obtained. According to the real values of the three-phase current (ia, ib, ic), the control unit 5 controls the operation of the driving unit 2 in order to adjust the frequency or the amplitude of the three-phase current (ia, ib, ic).

In a preferred embodiment, before the brake device fixes the motor, the control unit 5 acquires the latest DC values of the three-phase current (ia, ib, ic) as the three-phase demagnetization values. For example, as shown in FIG. 3C, the time interval 2 is ended at the time point t=1 second. Consequently, the control unit 5 acquires the latest values of the three-phase current (ia, ib, ic) as the three-phase demagnetization values at the time point t=1 second. That is, in the time interval 2, the control unit 5 continuously stores the DC values of the three-phase current (ia, ib, ic) into the storage unit 4. At the beginning of the time interval 3, the control unit 5 acquires the latest DC values stored in the storage unit 4 and takes the latest DC values as three-phase demagnetization values. After the demagnetization procedure and the correction procedure are performed, the accuracy of the current sensor 30 is largely increased.

Moreover, according to the real values of the three-phase current (ia, ib, ic), the control unit 5 generates a pulse modulation signal to the driving unit 2 to control the switching actions of the plurality of switch elements in the inverter 21 of the driving unit 2. Consequently, the driving unit 3 generates the three-phase current (ia, ib, ic) in the AC state or the DC state. Moreover, according to the d-axis correction current command and the q-axis correction current command, the control unit 5 generates a pulse modulation signal to the driving unit 2 to control the switching actions of the plurality of switch elements in the inverter 21 of the driving unit 2. Consequently, the driving unit 2 generates the three-phase demagnetization currents.

In some other embodiments, the technologies of the present disclosure can be applied to the other systems with the AC/DC current switching mechanisms, e.g., an Internet of Things (IoT) system, a smart grid system or the like.

The computing principles of the control unit 5 will be described in more details as follows.

Firstly, the d-axis current id and the q-axis current iq can be calculated according to the three-phase current (ia, ib, ic) by using the following mathematic formula (1). The mathematic formula (1) may be expressed as:

$$\begin{bmatrix} i_d \\ i_q \end{bmatrix} = T_{abc}^{dq}(\theta_e) \begin{bmatrix} i_a \\ i_b \\ i_c \end{bmatrix} = \frac{2}{3} \begin{bmatrix} \sin\theta_e & \sin\left(\theta_e - \frac{2\pi}{3}\right) & \sin\left(\theta_e + \frac{2\pi}{3}\right) \\ \cos\theta_e & \cos\left(\theta_e - \frac{2\pi}{3}\right) & \cos\left(\theta_e + \frac{2\pi}{3}\right) \end{bmatrix} \begin{bmatrix} i_a \\ i_b \\ i_c \end{bmatrix}; \quad (1)$$

In the above mathematic formula, $T_{abc}{}^{dq}$ is a transformation matrix that transforms the stationary coordinates to the rotation coordinates, and $\theta_e$ is the rotor angle.

Consequently, when the load device 9 is subjected to the zero-speed control operation, the DC values of the phase current components ia, ib and ic of the three-phase current maintained at the DC state are taken as the three-phase demagnetization values under control of the control unit 5. In addition, the d-axis current id and the q-axis current iq can be calculated according to the three-phase demagnetization values by using the following mathematic formula (2). After the three-phase demagnetization values $i_{a\_stop}$, $i_{b\_stop}$ and $i_{c\_stop}$ are substituted into the mathematic formula (1), the mathematic formula (2) is obtained and be expressed as:

$$\begin{bmatrix} i_{d\_stop} \\ i_{q\_stop} \end{bmatrix} = T_{abc}^{dq}(\theta_e) \begin{bmatrix} i_{a\_stop} \\ i_{b\_stop} \\ i_{c\_stop} \end{bmatrix}; \quad (2)$$

In the above mathematic formula, $i_{d\_stop}$ and $i_{q\_stop}$ are the d-axis current id and the q-axis current iq that are calculated by the control unit 5, and $i_{a\_stop}$, $i_{b\_stop}$ and $i_{c\_stop}$ are the three-phase demagnetization values.

Moreover, the control unit 5 calculates a d-axis correction current command and a q-axis correction current command according to a proportional constant, the d-axis current and the q-axis current according to the following mathematic formula (3). The mathematic formula (3) may be expressed as:

$$\begin{bmatrix} i^*_{d\_DeMag} \\ i^*_{q\_DeMag} \end{bmatrix} = -K_{DeMag} \begin{bmatrix} i_{d\_stop} \\ i_{q\_stop} \end{bmatrix}; \quad (3)$$

In the above mathematic formula, $i^*_{d\_DeMag}$ is the d-axis correction current command, $i^*_{q\_DeMag}$ is the q-axis correction current command, $K_{DeMag}$ is the proportional constant, $i_{d\_stop}$ is the d-axis current id, and $i_{q\_stop}$ is the q-axis current iq.

Moreover, the control unit 5 controls the driving unit 2 to drive the load device 9 to generate a three-phase demagnetization current to the measuring unit 3 according to the d-axis correction current command and the q-axis correction current command. The three-phase demagnetization current ($i^*_{a\_DeMag}$, $i^*_{b\_DeMag}$, $i^*_{c\_DeMag}$) can be obtained according to the following mathematic formulae (4) and (5):

$$T_{dq}^{abc}(\theta_e)\begin{bmatrix} i^*_{d\_DeMag} \\ i^*_{q\_DeMag} \end{bmatrix} = \begin{bmatrix} i^*_{a\_DeMag} \\ i^*_{b\_DeMag} \\ i^*_{c\_DeMag} \end{bmatrix} = -K_{DeMag}\begin{bmatrix} i_{d\_stop} \\ i_{q\_stop} \end{bmatrix}; \quad (4)$$

$$\begin{bmatrix} i^*_{a\_DeMag} \\ i^*_{b\_DeMag} \\ i^*_{c\_DeMag} \end{bmatrix} = (-K_{DeMag})\begin{bmatrix} i_{a\_stop} \\ i_{b\_stop} \\ i_{c\_stop} \end{bmatrix}. \quad (5)$$

Figure 4:
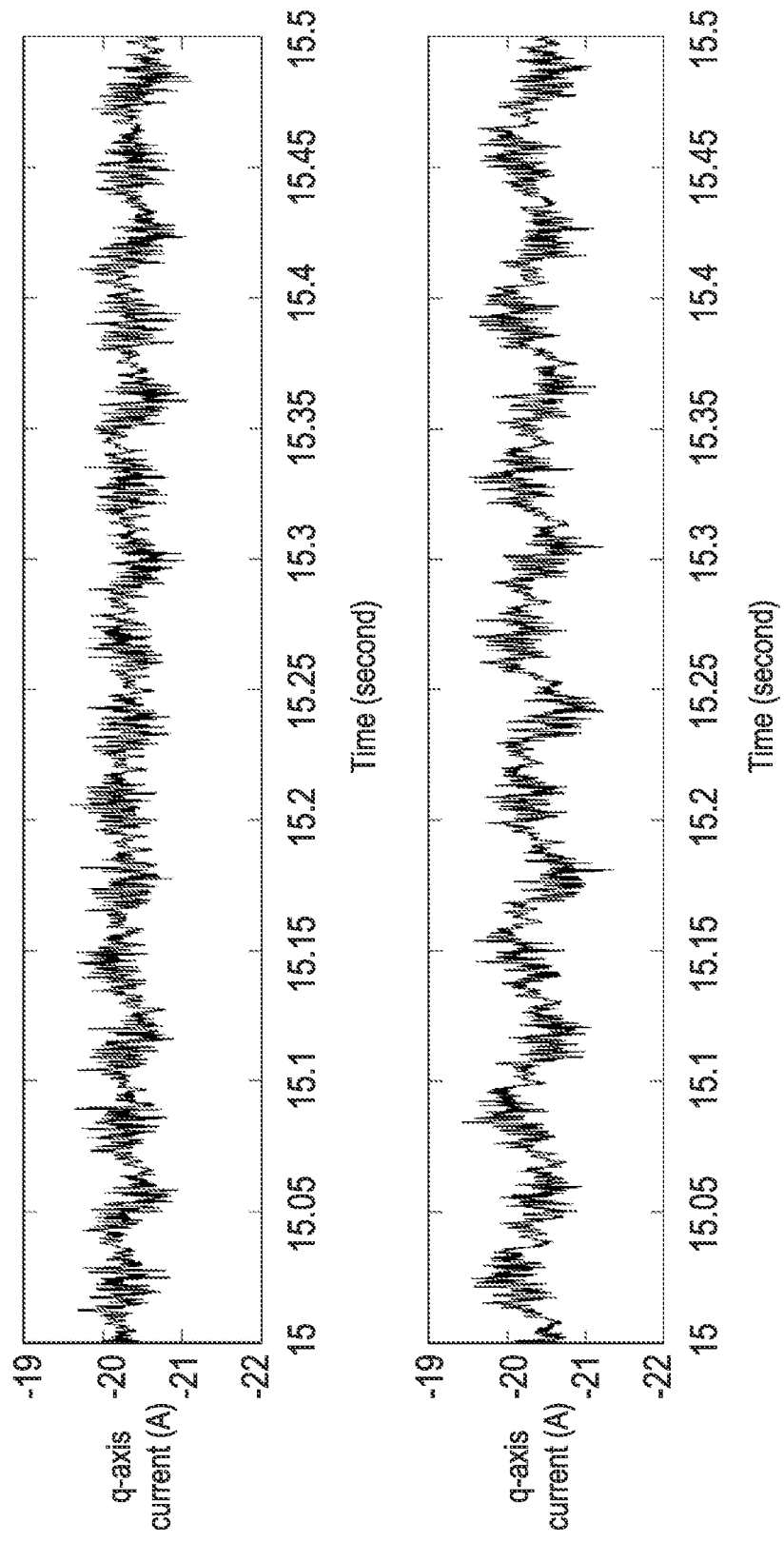
FIG. 4 is a schematic timing waveform diagram illustrating the comparison between the q-axis current from the driving system of the present disclosure and the q-axis current from the conventional driving system after the three-phase current is transformed to the dq frame.
Figure 5:
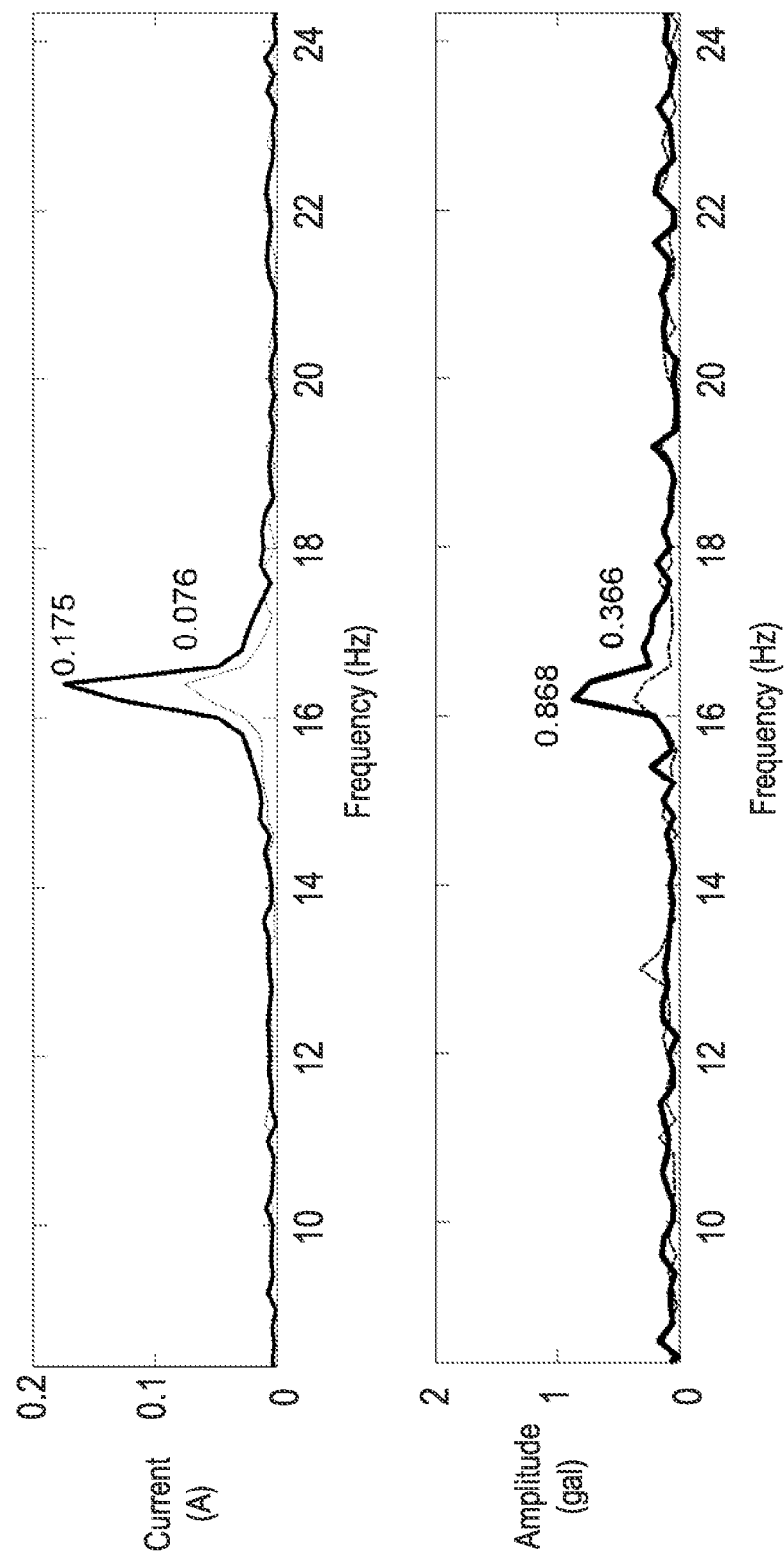
FIG. 5 is a schematic waveform diagram illustrating the relationship between the harmonic current and the vibration frequency of the driving system of the present disclosure and the relationship between the harmonic current and the vibration frequency of the conventional driving system.

Please refer to FIGS. 4 and 5. FIG. 4 is a schematic timing waveform diagram illustrating the comparison between the q-axis current from the driving system of the present disclosure and the q-axis current from the conventional driving system after the three-phase current is transformed to the dq frame. FIG. 5 is a schematic waveform diagram illustrating the relationship between the harmonic current and the vibration frequency of the driving system of the present disclosure and the relationship between the harmonic current and the vibration frequency of the conventional driving system. As mentioned above, the control unit 5 controls the driving unit 2 to drive the load device 9 to generate the three-phase demagnetization current to the measuring unit 3. Due to the three-phase demagnetization current, the measuring unit 3 is demagnetized. As shown in FIG. 4, the driving system 1 of the present disclosure (i.e., the upper part of FIG. 4) can effectively reduce the output matrix ripple when compared with the conventional driving system (i.e., the lower part of FIG. 4). As shown in FIG. 5, the driving frequency is identical (e.g., 16.3 Hz). The harmonic current of the present driving system 1 (i.e., the dotted line in the upper part of FIG. 5) has about 56.5% reduction when compared with the conventional driving system (i.e., the solid line in the upper part of FIG. 5). The vibration amplitude of the present driving system 1 (i.e., the dotted line in the lower part of FIG. 5) has about 57.8% reduction when compared with the conventional driving system (i.e., the solid line in the lower part of FIG. 5). In other words, the driving system of the present disclosure can implement the current offset correction more accurately. Consequently, the performance of the driving system of the present disclosure is largely enhanced.

FIG. 6 is a flowchart of a current sensing correction method according to an embodiment of the present disclosure. The current sensing correction method is applied to the driving system 1 as shown in FIGS. 3A, 3B and 3C. The driving system 1 includes the driving unit 2, the control unit 5, the measuring unit 3 and the storage unit 4. The current sensing correction method can be implemented by the control unit 5. The driving unit 2 can provide a three-phase current (ia, ib, ic) to the load device 9 to drive the operation of the load device 9. The current sensing correction method includes the following steps.

In a step S1, the control unit 5 acquires the detection values (iat, ibt, ict) of a three-phase current (ia, ib, ic) through the measuring unit 3.

In a step S2, the control unit 5 determines whether the three-phase current (ia, ib, ic) is maintained at a DC state according to the detection values (iat, ibt, ict) of the three-phase current (ia, ib, ic). When the three-phase current (ia, ib, ic) is not maintained at the DC state, the control unit 5 performs the step S1 again. Whereas, when the three-phase current (ia, ib, ic) is maintained at the DC state, the control unit 5 performs a step S3.

In the step S3, when the three-phase current (ia, ib, ic) is maintained at the DC state, the control unit 5 acquires the DC values of the three-phase current (ia, ib, ic) through the measuring unit 3.

In the step S4, the control unit 5 records the DC values of the three-phase current (ia, ib, ic) in the storage unit 4 as three-phase demagnetization values.

In the step S5, the control unit 5 determines whether the detection values (iat, ibt, ict) of the three-phase current (ia, ib, ic) are zero. When the control unit 5 determines that the detection values (iat, ibt, ict) of the three-phase current (ia, ib, ic) are zero, it means that the brake device is enabled to fix the motor. Consequently, the control unit 5 continuously performs a step S6. In the step S6, the control unit 5 calculates a d-axis current and a q-axis current according to the three-phase demagnetization values. Whereas, when the control unit 5 determines that the detection values (iat, ibt, ict) of the three-phase current (ia, ib, ic) are not zero, the control unit 5 performs the step S3, S4 and S5 again so as to store the three-phase demagnetization values in the storage unit 4 repeatedly.

In some embodiments, the current sensing correction method further includes the following steps.

In a step S7, the control unit 5 calculates a d-axis correction current command and a q-axis correction current command according to a proportional constant, the d-axis current and the q-axis current. In an embodiment, the steps S2 to S7 are performed in the time interval 2 and the time interval 3 as shown in FIGS. 3B and 3C.

In a step S8, the control unit 5 controls the driving unit 2 to generate a three-phase demagnetization current to the measuring unit 3 according to the d-axis correction current command and the q-axis correction current command. In an embodiment, the step S8 is performed in the time interval 4 as shown in FIGS. 3B and 3C.

In a step S9, the control unit 5 determines if a demagnetization time representing that the measuring unit 3 receives the three-phase demagnetization current reaches a first predetermined time. For example, as shown in FIG. 3C, the time interval 4 is in the range between the 1.5-th second and 2nd second. That is, the first predetermined time is 0.5 second. The first predetermined time is set through an application program. Moreover, the first predetermined time can be adjusted according to the practical requirements.

When the determining result of the step S9 indicates that the demagnetization time reaches the first predetermined time, a step S10 is performed. In the step S10, the control unit 5 controls the driving unit 2 to stop generating the three-phase demagnetization current. After the step S10 is completed, the measuring unit 3 is demagnetized. When the determining result of the step S9 indicates that the demagnetization time has not reached the first predetermined time, the step S8 is repeatedly done.

After the step S10, a step S11 is performed. In the step S11, the three-phase current measured by the measuring unit 3 is taken as a three-phase current correction value under the control of the control unit 5. In an embodiment, the step S11 is performed in the time interval 5 as shown in FIGS. 3B and 3C.

In the step S12, the control unit 5 determines if a correction time of keeping the three-phase current correction value constantly reaches a second predetermined time. For example, as shown in FIG. 3C, the time interval 5 is in the range between the 2nd second and the 2.5-th second. That is, the second predetermined time is 0.5 second. The second predetermined time is set through an application program. Moreover, the second predetermined time can be adjusted according to the practical requirements.

When the determining result of the step S12 indicates that the correction time reaches the second predetermined time, a step S13 is performed. In the step S13, the control unit 5 stores the three-phase current correction value in the storage unit 4. Whereas, when the determining result of the step S12 indicates that the correction time has not reached the second predetermined time, the control unit 5 performs the step S11 again.

It is noted that the sequence of the steps S1 to S13 in the flowchart of FIG. 6 is not restricted and can be varied according to the practical requirements.

From the above descriptions, the present disclosure provides a current sensing correction method and a driving system using the current sensing correction method. When a load device enters the start-up state, a driving unit of the driving system is enabled to generate a three-phase demagnetization current to a measuring unit in order to demagnetize the measuring unit. In other words, the driving system of the present disclosure can implement the current offset correction more accurately. Consequently, the performance of the driving system is enhanced, and the vibration and noise generated by the load device are reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A current sensing correction method for a driving system, wherein the driving system comprises a driving unit, a control unit, a measuring unit and a storage unit, and the driving unit is configured to provide a three-phase current to a load device, and the control unit is configured to perform the current sensing correction method comprising:
   acquiring detection values of the three-phase current through the measuring unit;
   determining whether the three-phase current is maintained at a DC state according to the detection values of the three-phase current;
   when the three-phase current is maintained at the DC state, acquiring DC values of the three-phase current through the measuring unit;
   recording the DC values of the three-phase current in the storage unit as three-phase demagnetization values;
   wherein when the control unit determines that the detection values are zero, the current sensing correction method further comprises:
   calculating a d-axis current and a q-axis current according to the three-phase demagnetization values;
   calculating a d-axis correction current command and a q-axis correction current command according to a proportional constant, the d-axis current and the q-axis current;
   controlling the driving unit to generate a three-phase demagnetization current to the measuring unit according to the d-axis correction current command and the q-axis correction current command; and
   determining if a demagnetization time representing that the measuring unit receives the three-phase demagnetization current reaches a first predetermined time; and
   wherein when the demagnetization time reaches the first predetermined time, the control unit controls the driving unit to stop generating the three-phase demagnetization current.

2. The current sensing correction method according to claim 1, further comprising: wherein when the demagnetization time reaches the first predetermined time, the measuring unit measures the three-phase current that is taken as a three-phase current correction value.

3. The current sensing correction method according to claim 2, further comprising:
   determining if a correction time of keeping the three-phase current correction value constantly reaches a second predetermined time;
   wherein when the correction time reaches the second predetermined time, the three-phase current correction value is stored in the storage unit.

4. A driving system, comprising:
   a driving unit configured to provide a three-phase current to a load device;
   a measuring unit configured to measure the three-phase current and generate detection values of the three-phase current;
   a storage unit; and a control unit connected with the driving unit, the measuring unit and the storage unit, wherein the control unit determines whether the three-phase current is maintained at a DC state according to the detection values of the three-phase current;

wherein when the control unit determines that the three-phase current is maintained at the DC state, the control unit acquires DC values of the three-phase current through the measuring unit and records the DC values of the three-phase current in the storage unit as three-phase demagnetization values;

wherein when the control unit determines that the detection values are zero, the control unit calculates a d-axis current and a q-axis current according to the three-phase demagnetization values, and calculates a d-axis correction current command and a q-axis correction current command according to a proportional constant, the d-axis current and the q-axis current;

wherein the control unit controls the driving unit to generate a three-phase demagnetization current to the measuring unit according to the d-axis correction current command and the q-axis correction current command.

5. The driving system according to claim 4, wherein the control unit determines if a demagnetization time representing that the measuring unit receives the three-phase demagnetization current reaches a first predetermined time;

wherein when the demagnetization time reaches the first predetermined time, the control unit controls the driving unit to stop generating the three-phase demagnetization current.

6. The driving system according to claim 5, wherein when the demagnetization time reaches the first predetermined time, the control unit acquires the three-phase current through the measuring unit, and the three-phase current is taken as a three-phase current correction value.

7. The driving system according to claim 6, wherein when the control unit determines if a correction time of keeping the three-phase current correction value constantly reaches a second predetermined time;

wherein when the correction time reaches the second predetermined time, the control unit stores the three-phase current correction value in the storage unit.

8. The driving system according to claim 7, wherein when the control unit acquires the detection values through the measuring unit, the control unit acquires the three-phase current correction value from the storage unit.

9. The driving system according to claim 8, wherein the three-phase correction value stored in the storage unit is subtracted from the detection values by the control unit to obtain real values of the three-phase current, and the control unit operates the driving unit according to the real values of the three-phase current.

10. The driving system according to claim 4, wherein the measuring unit comprises three Hall sensors for measuring three phase current components of the three-phase current.

11. The driving system according to claim 4, wherein the measuring unit comprises two Hall sensors for measuring a first phase current component and a second phase current component of the three-phase current, and the control unit calculates a third phase current component according to the first phase current component and the second phase current component.

* * * * *